United States Patent
Tada et al.

[11] Patent Number: 6,069,093
[45] Date of Patent: May 30, 2000

[54] PROCESS OF FORMING METAL FILMS AND MULTI LAYER STRUCTURE

[75] Inventors: Kunihiro Tada; Satoshi Wakabayashi, both of Nirasaki, Japan

[73] Assignee: Tokyo Electron Limited, Tokyo, Japan

[21] Appl. No.: 09/098,731

[22] Filed: Jun. 18, 1998

[30] Foreign Application Priority Data

Jun. 25, 1997 [JP] Japan ................................. 9-184381

[51] Int. Cl.⁷ .................................................. H01L 21/31
[52] U.S. Cl. .......................... 438/761; 438/683; 438/653; 438/656; 427/255.7; 427/255.2
[58] Field of Search .......................... 438/680, 683, 438/685, 653, 656, 682, 761, 625, 622, 637; 427/255, 255.1, 255.2, 255.7

[56] References Cited

U.S. PATENT DOCUMENTS

| | | | |
|---|---|---|---|
| 5,628,829 | 5/1997 | Foster et al. | 118/723 |
| 5,639,678 | 6/1997 | Lee et al. | 437/41 |
| 5,736,192 | 4/1998 | Okamoto | 427/99 |
| 5,770,520 | 6/1998 | Zhao et al. | 438/653 |
| 5,824,599 | 10/1998 | Schacham-Diamand et al. | 438/678 |
| 5,866,205 | 2/1999 | Vaartstra et al. | 427/255.1 |
| 5,903,053 | 5/1999 | Iijima et al. | 257/751 |
| 5,918,150 | 6/1999 | Nguyen et al. | 438/687 |
| 5,943,559 | 8/1999 | Maeda | 438/149 |
| 5,950,083 | 9/1999 | Inoue et al. | 438/233 |
| 5,956,616 | 9/1999 | Mizuno et al. | 438/680 |
| 5,958,508 | 9/1999 | Adetutu et al. | 427/248.1 |

FOREIGN PATENT DOCUMENTS

| | | |
|---|---|---|
| 63 280 417 | 11/1988 | Japan . |
| 2 162 722 | 6/1990 | Japan . |
| 7 130 742 | 5/1995 | Japan . |

*Primary Examiner*—Matthew Smith
*Assistant Examiner*—Robert A. Hullinger
*Attorney, Agent, or Firm*—Oblon, Spivak, McClelland, Maier & Neustadt, P.C.

[57] ABSTRACT

In a process of forming a metal film, when metal wiring is formed on a diffusion layer (an electrode, etc.) of a circuit element formed on a silicon semiconductor wafer, a Ti film is deposited on a surface of a processed body by PECVD using $TiCl_4$ gas and $H_2$ gas as material gas. A Ti—Si—N film is formed on the diffusion layer surface by adding $N_2$ gas to the material gas, and the Ti film is formed subsequently on the Ti—Si—N film. The Ti—Si—N film suppresses diffusion of silicon from the semiconductor wafer side.

7 Claims, 6 Drawing Sheets

PROCESS OF FORMING METAL FILMS AND MULTI LAYER STRUCTURE

BACKGROUND OF THE INVENTION

The present invention relates to a process of forming metal films when, for example, contact metals are formed, on a silicon semiconductor substrate and a multi layer structure.

Generally, film formation process and pattern etching process are repeated on a semiconductor substrate (hereinafter called a semiconductor wafer) of silicon to form a semiconductor integrated circuit comprising a number of circuit elements.

In this manufacturing process, materials which are low in the electric resistance and excellent in resistance to corrosion are suitable for metal wiring connecting between the circuit elements, contact metals for making electric contact with the circuit elements, and barrier metals for suppressing diffusion of Si of the substrate.

As for the materials, refractory metal materials such as Ti, W and Mo are selected. Particularly, a Ti film has excellent electrical characteristics and is resistant to corrosion and is used widely.

For example, according to a CVD (chemical vapor deposition) process using a CVD device, a Ti film is deposited by the plasma process in an atmosphere into which $TiCl_4$ gas and $H_2$ gas are introduced.

Here a conventional film forming process when contacts are made at elements on the semiconductor wafer surface will be described.

Figure 10:
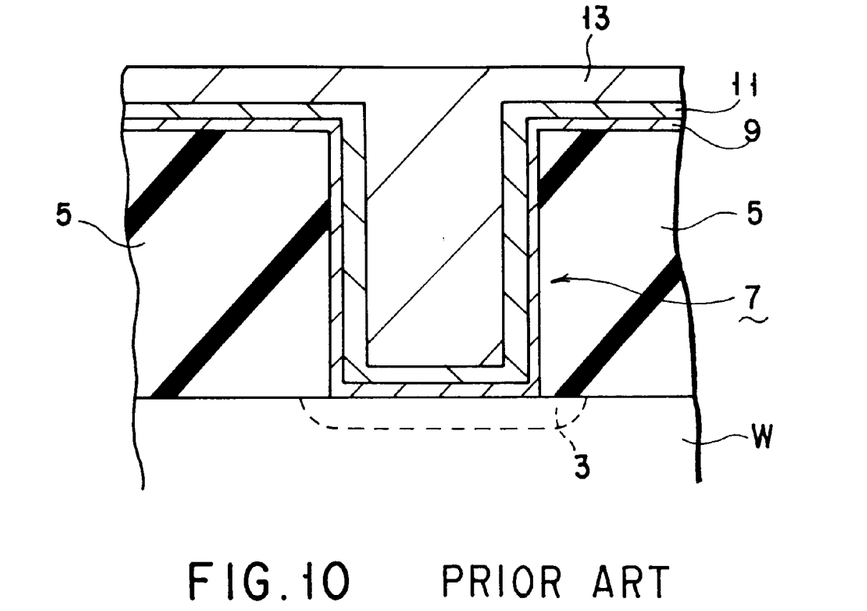
FIG. 10 is a cross-sectional view showing a multi layer structure explaining the conventional metal film forming process.

FIG. 10 shows a cross section of a portion which is in contact with circuit elements, for example, the sources/drains of transistors formed on the semiconductor wafer.

In the drawing, W represents a semiconductor wafer formed of, for example, a silicon substrate. A diffusion layer 3 is formed partially on a surface of the silicon substrate, and also a number of drains and sources of transistors are formed.

The drawing shows only one contact portion. An interlayer insulation film 5 made of, for example, $SiO_2$, is formed on the surface of the semiconductor wafer W, a contact hole 7 is formed by removing the interlayer insulation film 5 over the diffusion layer 3, and wiring is connected to the diffusion layer 3 so as to make electric connection to other circuit elements.

As its typical example, a very thin Ti film 9 that is to be a contact metal is first formed on the entire semiconductor wafer surface including the interior (a wall portion) of the contact hole 7, a TiN film 11 that is to be a barrier metal, for example, is deposited on the Ti film 9, and finally a metal film 13 of tungsten or aluminum that is to be used as wiring is formed and embedded in the contact hole 7 so as to make electric connection to the diffusion layer 3.

The Ti film 9 that is to be a contact metal aims to suppress the contact resistance to the diffusion layer 3, and the TiN film 11 that is to be a barrier metal aims to suppress the mutual diffusion between the silicon component of the semiconductor wafer and the wiring metal.

When the Ti film 9 is deposited, $TiCl_4$ gas and $H_2$ gas are supplied as material gases, Ar gas is also supplied as gas for plasma generation, and $TiCl_4$ gas is reduced in the presence of the plasma.

Figure 11:
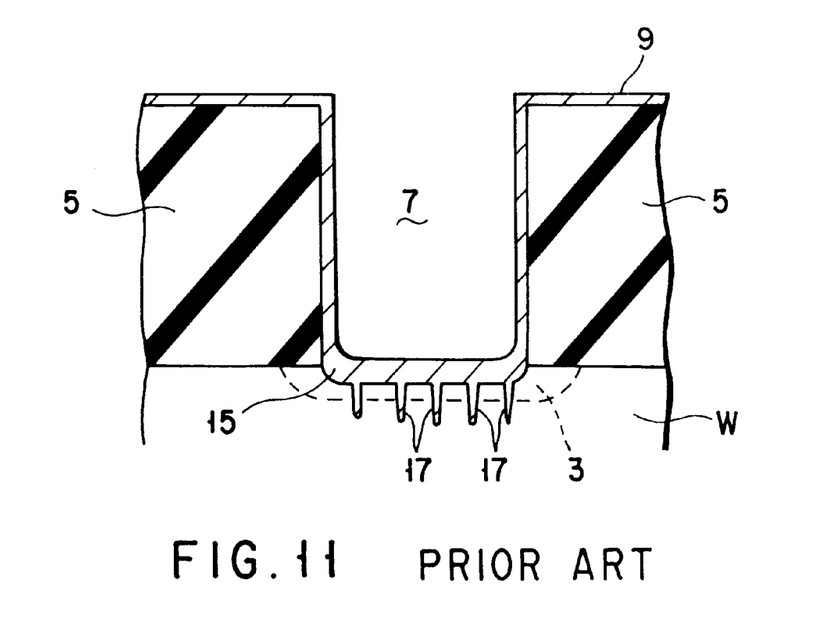
FIG. 11 is a cross-sectional view showing a multi layer structure explaining a problem of the conventional metal film forming process.

When the Ti film 9 is deposited as described above, the state of the chemical element Ti is maintained at the portion where the Ti film 9 is in contact with the chemically stable interlayer insulation film 5 since no reaction is made there, but, at the hole bottom portion where the Ti film 9 is in contact with the silicon region of the diffusion layer 3, Ti reacts with Si immediately and a $TiSi_2$ film 15 is thereby formed, as shown in FIG. 11. This $TiSi_2$ film 15 is about 2.5 times thicker than the Ti film 9, and its film thickness is greater along the direction of the diffusion layer 3.

In addition, the Ti film 9 cannot be prevented from corroding Si of the diffusion layer 3 side to a certain depth and absorbing Si. Due to this absorption the $TiSi_2$ film 15 expands partially downward in a spike so as to form projections 17.

If the projections 17 break through the diffusion layer 3 and reach the semiconductor wafer at the lower side, the Ti film 9 becomes electrically conductive with the semiconductor, which causes contact leak.

Particularly, as the circuit elements are highly integrated and highly miniaturized, the diffusion layer 3 is so thinner that the frequency of occurrence of the contact leak becomes higher, which causes defectiveness and damage of articles at their manufacturing time.

BRIEF SUMMARY OF THE INVENTION

The present invention aims at providing a metal film forming process and a multi layer structure which can suppress diffusion of a silicon area of a semiconductor substrate and absorption of silicon when a metal film for wiring is formed at a circuit element formed on a semiconductor substrate.

According to the present invention, in a film forming process wherein a Ti film is deposited on a surface of a processed body by plasma enhanced chemical vapor deposition (PECVD) using $TiCl_4$ gas and $H_2$ gas as the material gas, $N_2$ gas is added to the material gas when formation of the Ti film is started, so that a thin Ti—Si—N film is formed on the silicon surface. In a preferred embodiment, then only addition of $N_2$ gas is stopped to continue the formation of the Ti film from the material gas.

By adding $N_2$ gas, the Ti film formed at a portion which is to be in contact with the silicon surface of the semiconductor wafer absorbs $N_2$ molecules and immediately reacts with the silicon, and a Ti—Si—N film is thereby formed.

The Ti—Si—N film intervenes between the semiconductor wafer (silicon) and the Ti film, suppresses the diffusion of silicon as compared with Ti, prevents the generation of the projections, and further suppresses the generation of the contact leak.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

The aspects of the present invention will be described in detail with reference to the drawings.

Figure 1:
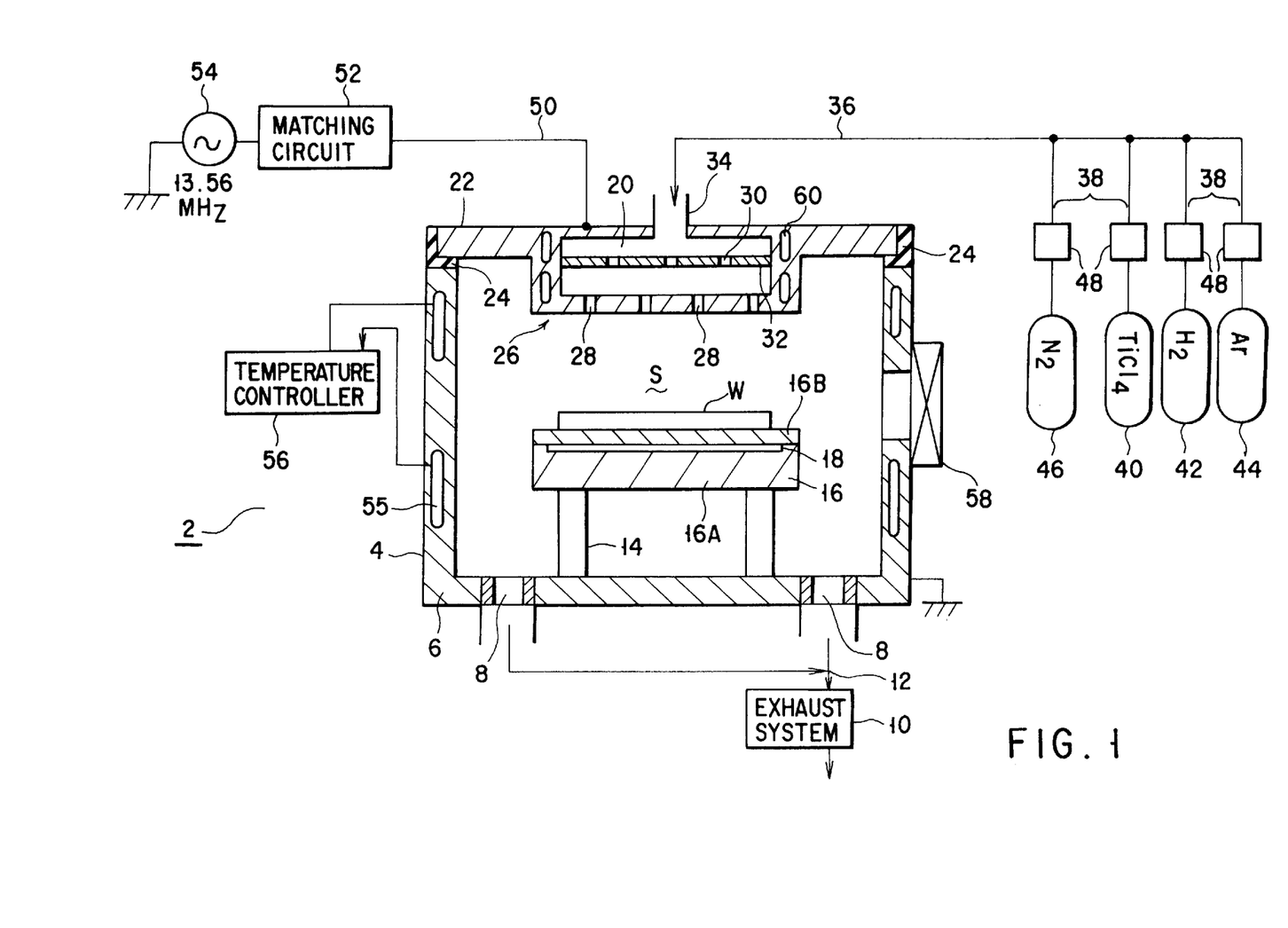
FIG. 1 shows an example of a structure of a PECVD device used to carry out a metal film forming process according to the present invention.

FIG. 1 shows an example of the structure of a plasma PECVD system to explain the film forming process of the present invention.

In this aspect, a case where a Ti film is formed as a metal film in the CVD system will be described.

The PECVD system 2 comprises, for example, a process chamber (a reaction chamber) 4 of stainless steel, and the electric potential of this process chamber 4 is grounded.

A plurality of exhaust ports 8 are provided at a bottom portion 6 of the process chamber 4. An exhaust system 10 including a vacuum drawing pump and the like is connected to the exhaust ports 8 to exhaust process gas and cleaning gas out of the process chamber uniformly or by drawing a vacuum.

Support columns 14 of a conductive material are fixed on the bottom surface of the process chamber 4. The support columns 14 support a susceptor 16 on which an article to be processed, for example, a semiconductor wafer W is placed.

This susceptor 16 also serves as a lower part electrode of the PECVD system with the same electric potential as that of the process chamber, and comprises a lower base 16A supported directly by the support column 14 and an upper base 16B bonded on the upper surface of the lower base 16A. A resistance heater 18 is sandwiched between the bonding surfaces of the stages. The lower base 16A and the upper base 16B are bonded by welding their bonded surfaces.

On the inner upper surface of the process chamber 4, a ceiling plate 22 at which a shower head 20 which also serves as an upper electrode is integrally provided is attached to sandwich insulating members 24 with the chamber side walls so that the chamber is airtight.

The shower head 20 is large enough to cover almost the entire surface of the upper surface of the susceptor 16 and is provided to face the susceptor 16. Process space S (a plasma region) is formed between the shower head 20 and the susceptor 16. The show head 20 introduces various kinds of gases into the process space S. A number of injection holes 28 for injecting the gases are formed on an injection surface 26 that is the lower surface of the shower head 20.

Inside the shower head 20 a diffusion plate 32 having a number of diffusion holes 30 is provided to diffuse the gases.

Further, at the upper part of the shower head 20 a gas introducing port 34 for introducing the material gases into the head is provided, which is connected to a material gas supply line 36.

The gas supply line 36 is branched to a plurality of branch pipes 38. The branch pipes 38 are connected respectively to a $TiCl_4$ gas source 40 for storing gas such as $TiCl_4$ gas used for both the film formation and the etching, an $H_2$ gas source 42 for storing $H_2$ gas, an Ar gas source 44 for storing plasma gas, for example, Ar gas, and an $N_2$ gas source 46 for storing inactive gas, for example, $N_2$ gas, used as carrier gas at the cleaning time.

The flow amount of each gas is controlled by flow amount controllers provided in the respective branch pipes, for example, mass flow controllers 48.

In the present aspect, the respective material gases for film deposition flow in the single gas pipe via the branch pipes 38, but the gas supply line connected to the shower head 20 is not limited to this, and what is called a postmix gas supply system may be employed in which the gas pipes of all the gases or some gases such as carrier gas and purge gas are independently connected to the shower head 20 and the gases are mixed in the shower head 20 or the process space S.

A matching circuit 52 and a high frequency power source 54 of, for example, 13.56 MHz are connected to the ceiling plate 22 via a lead line 50 to form plasma at the time of forming the Ti film.

Temperature control jackets 55 for vessel for selectively flowing, for example, a cooled medium, as it requires, are provided at the side walls of the process chamber 4 to adjust the temperature of the wall surface. The jackets 55 are connected to a temperature controller 56.

On the side wall of the process chamber 4, a gate valve 58 which is openable airtight when the semiconductor wafer W is carried in/out is provided.

Further, temperature control jackets 60 for head for selectively flowing a cooled medium as it requires are provided at the shower head 20 to adjust the temperature of the surface including the injection surface 26.

The wafer lifter pins for lifting or lowering the semiconductor wafer when it is carried in/out may be provided at the susceptor 6, though not shown in the drawing.

Next, the film forming process of the present invention carried out by using the device thus constituted, and the multi layer structure will be described with reference to FIGS. 2A to 2D and FIG. 3.

FIGS. 2A, 2B, 2C and 2D show the steps of the first aspect of the film forming process according to the present invention. FIG. 3 is an enlarged cross-sectional view showing part A of FIG. 2C.

An example of forming a Ti film on the surface of the semiconductor wafer of silicon will be described now.

First, the semiconductor wafer W is carried into the process chamber 4 from the outside or a load lock chamber (not shown) through the opened gate valve 58. The semiconductor wafer W is placed on the susceptor and the gate valve is closed. It is assumed that the contact hole 7 for making contact with the diffusion layer (electrode) 3 of the circuit element on the semiconductor wafer W has been formed on the surface of the carried semiconductor wafer W in the previous step.

After the gate valve 58 has been closed, drawing a vacuum is carried out to a predetermined degree of vacuum. $TiCl_4$ gas and $H_2$ gas as the material gases, Ar gas for plasma generation, and $N_2$ gas described below, are introduced into the process chamber 4 from the shower head 20, respectively, at predetermined flow amounts controlled by the mass flow controller 48, and the interior of the process chamber 4 is kept at a predetermined pressure by the vacuum system 10.

Simultaneously with this, high frequency of 13.56 MHz is applied to the shower head 20 serving as the upper electrode by the high frequency power source 54 so that a high frequency electric field is applied between the shower head 20 and the susceptor 16 serving as the lower electrode having the ground potential.

By this operation, Ar gas is processed to plasma so as to promote the reduction of $TiCl_4$ gas and $H_2$ gas, and the Ti film is deposited on the wafer surface. At this time, the temperature of the semiconductor wafer W is kept by heating at a predetermined degree by use of the resistance heater 18 embedded in the susceptor 16.

Also, the side wall of the process chamber 4 and the shower head 20 which are inclined to be heated by the generated plasma allow a refrigerant carrier to flow to the temperature control jackets 55 and 60 provided respectively at the side wall of the process chamber 4 and the shower head 20, and the temperature control jackets 55 and 60 are cooled to a predetermined temperature.

At this time the process conditions are that the wafer temperature (susceptor temperature) is approximately 600° C., the process pressure is approximately 1 Torr and the high frequency power is approximately 500 W.

In addition, introduced are $TiCl_4$ gas at 10 SCCM, $H_2$ gas at 1000 SCCM, Ar gas at 1000 SCCM, and $N_2$ gas at approximately 50 SCCM. The deposition time is approximately 30 seconds.

Figure 2A:
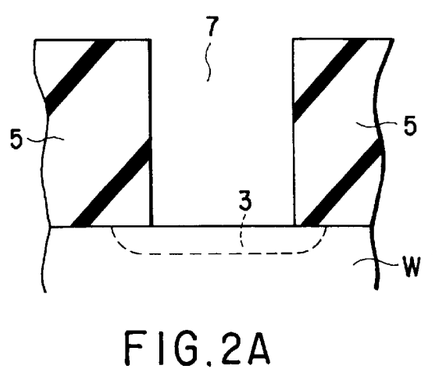
FIG. 2A shows a cross section of a multi layer structure in the steps of the metal film forming process of a first aspect.
Figure 3:
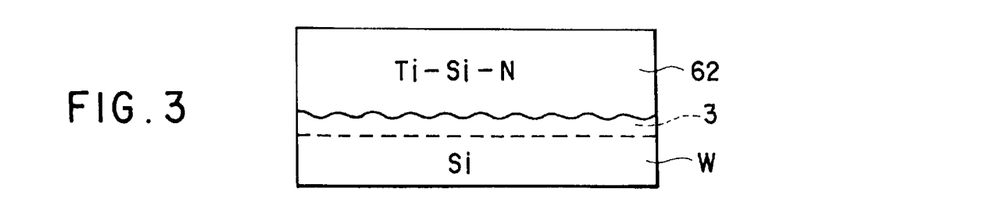
FIG. 3 shows an expanded cross section of a portion A shown in FIG. 2C.

FIG. 2A is a cross-sectional view showing one of the contact holes 7 on the semiconductor wafer W surface before the film is formed. This contact hole 7 is formed by making an opening at the $SiO_2$ interlayer insulation film, and its bottom portion exposes the diffusion layer 3. The diffusion layer 3, which is formed by implanting impurity in silicon, is, for example, a source/drain of the transistor.

Figure 2B:
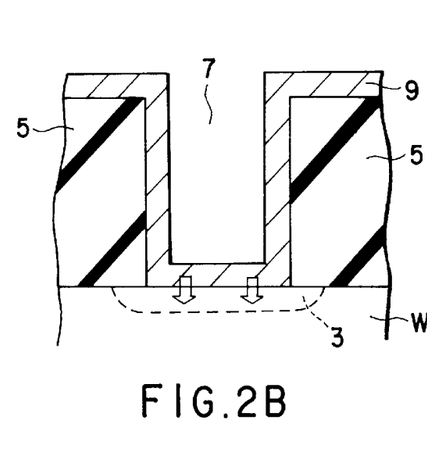
FIG. 2B shows a cross section of a multi layer structure in the steps of the metal film forming process of the first aspect following the steps of FIG. 2A.
Figure 2C:
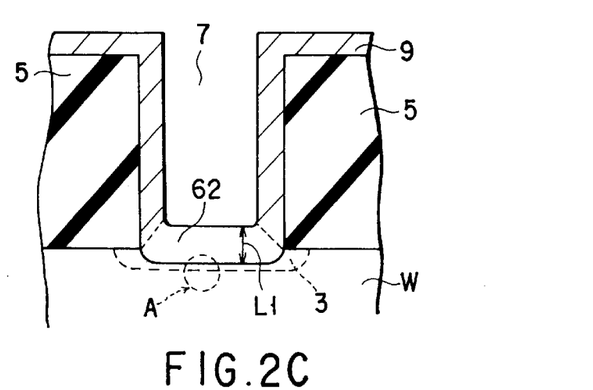
FIG. 2C shows a cross section of a multi layer structure in the steps of the metal film forming process of the first aspect following the steps of FIG. 2B.

If the Ti film is deposited on the semiconductor wafer surface in this manner, the Ti film 9 is initially deposited not only on the uppermost surface of the semiconductor wafer W, but also on the side walls of the contact hole 7 and the bottom portion, as shown in FIG. 2B. However, the Ti film 9 which is on contact with the diffusion layer 3 surface (silicon) exposed at the bottom portion of the contact hole 7 immediately makes reaction by absorbing the silicon and nitrogen in the atmosphere gas simultaneously with the film formation, and a Ti—Si—N layer 62 is thereby formed as shown in FIG. 2C.

Figure 2D:
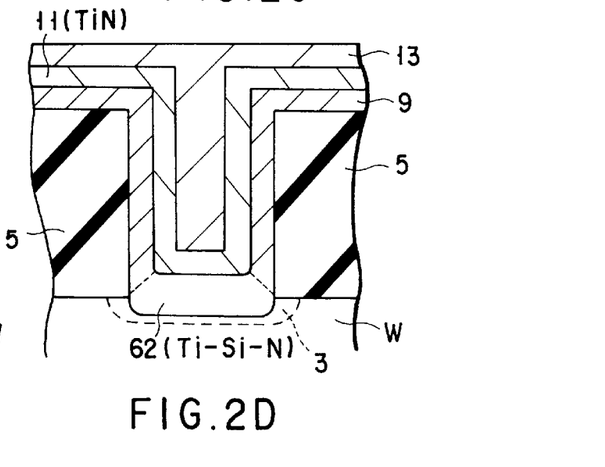
FIG. 2D shows a cross section of a multi layer structure in the steps of the metal film forming process of the first aspect following the steps of FIG. 2C.

After that, a TiN film 11 which is to serve as a barrier metal and a metal film 13 for wiring, as shown in FIG. 2D, are embedded in the contact hole 7 in the same manner as that of the conventional structure, to complete the embedding.

The diffusion of the Ti—Si—N film 62 to the silicon of the diffusion layer 3 is smaller than that of the above-described titanium silicide film (e.g. $TiSi_2$), which can suppress the absorption of silicon at the semiconductor wafer.

For this reason, it is possible to suppress the generation of the projections 17 shaped in spike as described in FIG. 11 and also the occurrence of the contact leak.

In this case, thickness L1 of the Ti—Si—N film 62 which is to be the contact metal is very small, for example, about 100 to 200 Å even in generally executed sputtering.

Further, since $N_2$ atoms that cause lowering of the contact resistance are included in the entire contact metal, its content, i.e. the amount of supplied $N_2$ gas is set to be remarkably small as described above so that the contact resistance of the Ti—Si—N film 62 of this time can be lower than a predetermined value, for example, 1000 Ω or lower.

In the above described 1st aspect, the contact metal is entirely formed in the single-layer structure of Ti—Si—N. However, the contact metal is not limited to this and may be in a double-layer structure of a Ti—Si—N film and a titanium silicide film as described in the following 2nd aspect.

Each of FIGS. 4A to 4D shows a cross-section of the multi layer structure according to the steps of the metal film forming process of the 2nd aspect. FIG. 5 is an expanded sectional view showing part B of FIG. 4C.

Figure 4A:
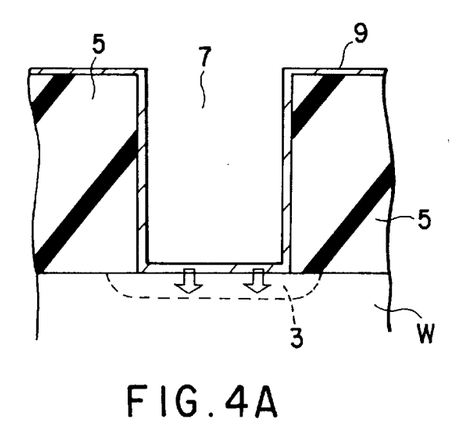
FIG. 4A shows a cross section of a multi layer structure in the steps of the metal film forming process of a second aspect.
Figure 5:
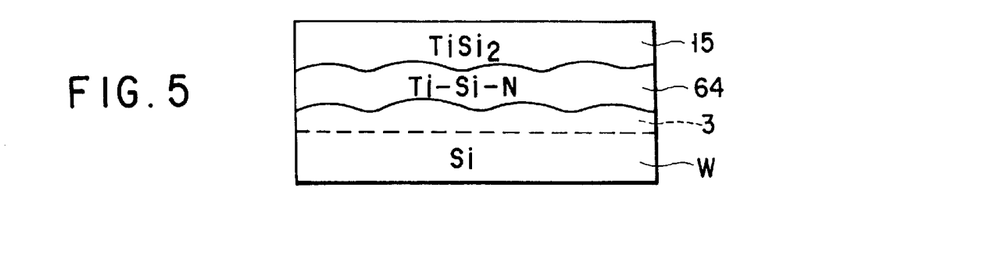
FIG. 5 shows an expanded cross section of a portion B shown in FIG. 4C.

First, as shown in FIG. 4A, $TiCl_4$ gas and $H_2$ gas as material gases, Ar gas as gas for plasma, and further $N_2$ gas for suppressing the corrosion of silicon, are supplied at predetermined flow amounts under the control of the mass flow controller 38, in the same manner as that of the 1st aspect, to form the Ti film 9 under the same conditions as those of the 1st aspect.

In the present aspect, the amount of supplied $N_2$ gas is larger than that in the 1st aspect, and the film forming time is shorter. In the 1st aspect, for example, the film is formed for 30 seconds by supplying $N_2$ gas at 50 (50 to 500) SCCM, while the film is formed for 6 seconds by supplying $N_2$ gas at 200 SCCM in the 2nd aspect. The high frequency power of this time is set at about 500 W.

Figure 4B:
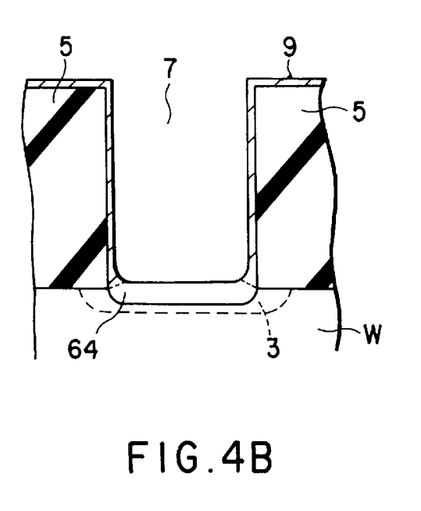
FIG. 4B shows a cross section of a multi layer structure in the steps of the metal film forming process of the second aspect following the steps of FIG. 4A.

In the present aspect, when the Ti film 9 is formed, the Ti film 9 that is deposited at the bottom portion of the contact hole 7 where the silicon surface of the diffusion layer 3 is exposed reacts immediately with silicon and nitrogen and a Ti—Si—N film 64 is thereby formed with a thickness larger than that of the Ti film 9 in the same manner as that of the above described 1st aspect, as shown in FIG. 4B. In this case, as the amount of supplied $N_2$ gas is increased, the amount of N atoms included in the Ti—Si—N film 64 is increased so as to increase the contact resistance, and therefore, the deposition time is shortened to suppress the increase in the thickness of the film.

After the film formation for 6 seconds including addition of $N_2$ gas has been carried out as described above, supply of $N_2$ gas is stopped and at the same time the supply amount of each of $TiCl_4$ gas, Ar gas and $H_2$ gas is maintained, and the process is transferred to a next step to deposit the Ti film for about 20 seconds. At this time, the high frequency power is lowered to about 200 W.

Figure 4C:
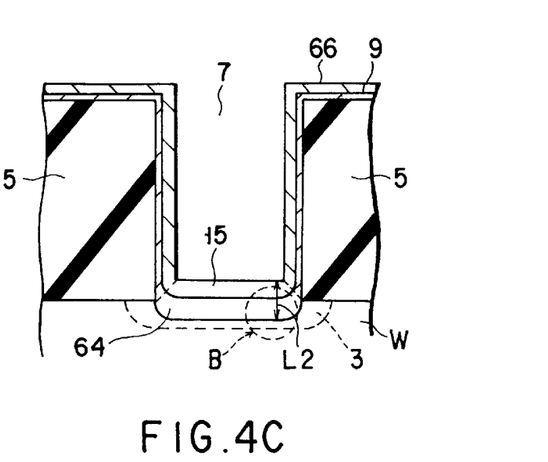
FIG. 4C shows a cross section of a multi layer structure in the steps of the metal film forming process of the second aspect following the steps of FIG. 4B.

By this operation, a Ti film 66 is deposited on the Ti film 9 (including the Ti—Si—N film 64) as shown in FIG. 4C.

At this time, the Ti film deposited on the Ti—Si—N film 64 at the bottom portion of the contact hole 7 reacts immediately with silicon of the diffusion layer 3 and a titanium silicide film (e.g. $TiSi_2$) is thereby formed. L2 representing the total thickness of the Ti—Si—N film 64 and its upper layer, i.e. the titanium silicide film 15, is about 80 Å, which is very thin.

Figure 4D:
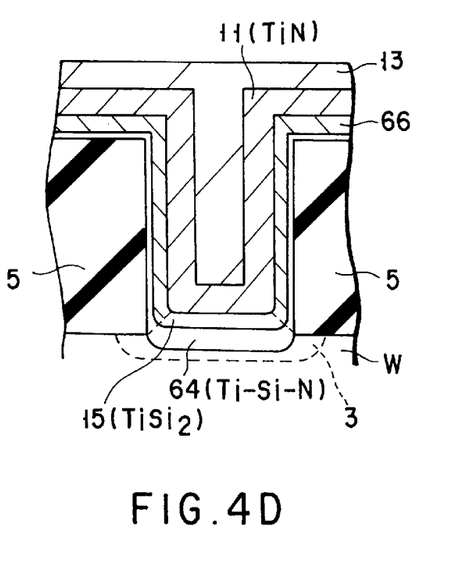
FIG. 4D shows a cross section of a multi layer structure in the steps of the metal film forming process of the second aspect following the steps of FIG. 4C.

In the following steps, the TiN film 11 serving as the barrier metal and the metal film 13 for wiring are formed sequentially and embedded in the contact hole 7 in the same manner as that of the 1st aspect, as shown in FIG. 4D.

Also in the present aspect, since the Ti—Si—N film 64 is formed at the portion which is in direct contact with the silicon surface, the corrosion of silicon is suppressed, the effect of absorption is weakened and generation of the projections on the surface is suppressed, as described above.

As a result, generation of the contact leak can be also suppressed similarly to the 1st aspect.

Figure 6:
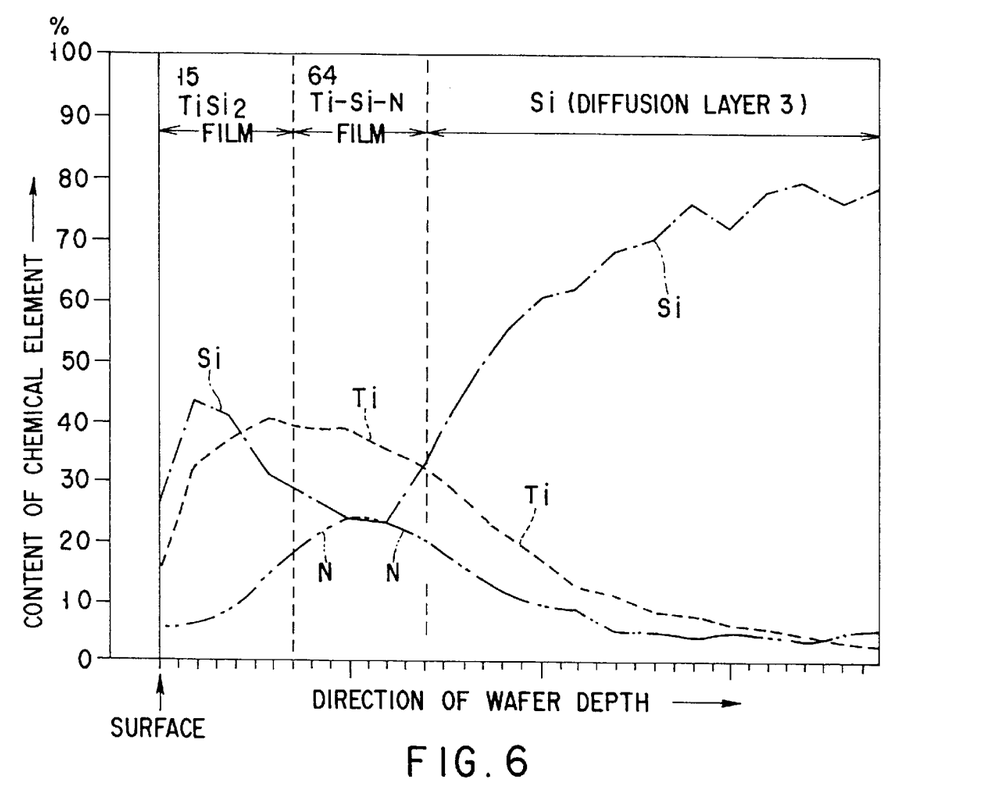
FIG. 6 is a graph showing a content of each chemical element in a film formed at a bottom portion of a contact hole of a semiconductor wafer, along the direction of the cross section, in the second aspect.

Next, FIG. 6 is a graph showing the content of each chemical element, in the direction of a cross section, in the film formed at the bottom portion of the contact hole of the semiconductor wafer in the 2nd aspect. In the drawing, the horizontal axis represents the depth direction of the wafer.

As clarified from this drawing, the right side area is an area of the diffusion layer 3 including very much Si, the area of its left side represents the Ti—Si—N film 64 in which Ti, Si and N are present at an appropriate amount, and the area of the further left side represents the titanium silicide film 15 in which much Ti and Si are present.

Figure 7:
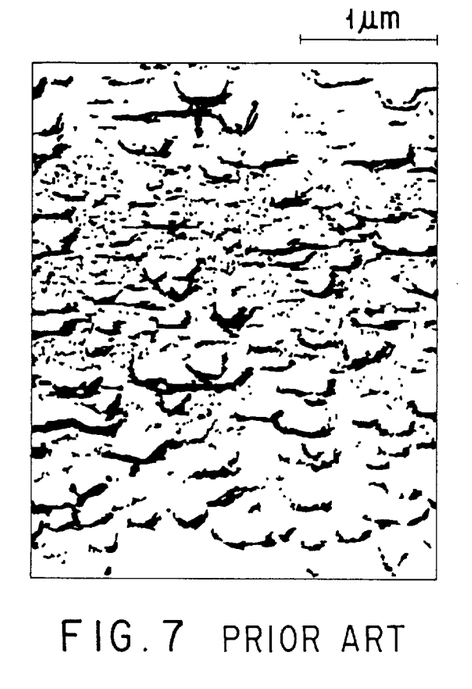
FIG. 7 is an expanded view showing a film interface according to a conventional metal film forming process.
Figure 8:
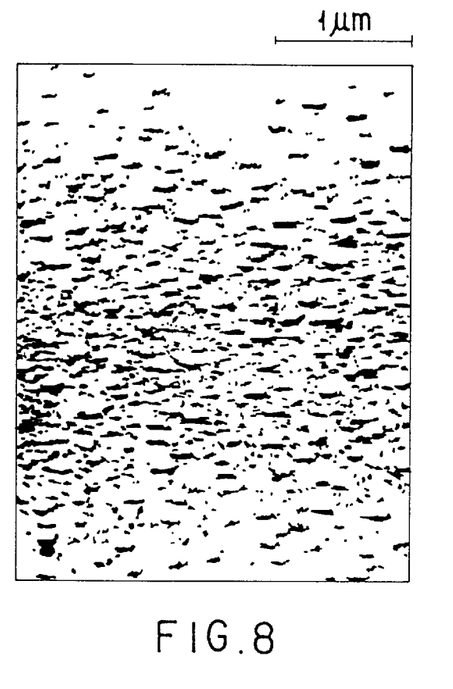
FIG. 8 is an expanded view showing a film interface according to the first aspect.
Figure 9:
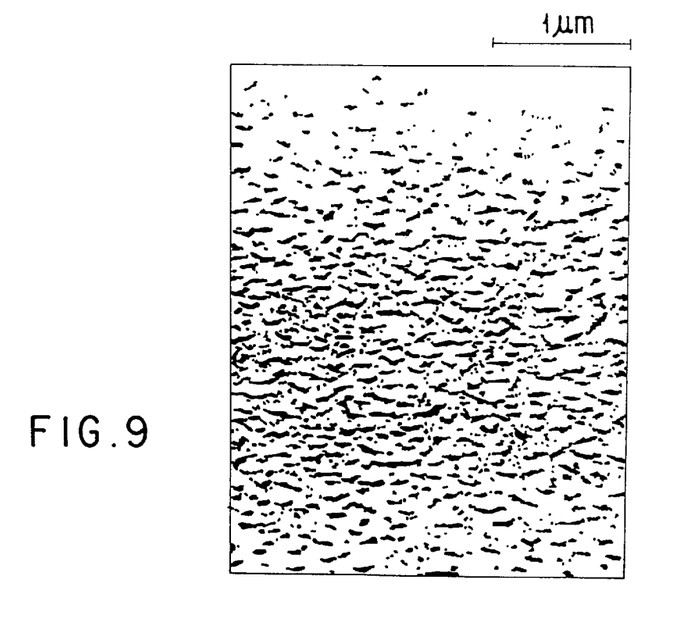
FIG. 9 is an expanded view showing a film interface according to the second aspect.

FIG. 8 is an expanded view showing the state of the surface of the Ti film formed by the metal film forming process according to the 1st aspect of the present invention. FIG. 9 is an expanded view showing the state of the surface of the Ti film formed by the metal film forming process according to the 2nd aspect of the present invention. FIG. 7 is an expanded view showing the state of the surface of the Ti film formed by a conventional metal film forming process. Each drawing schematically shows a reversed black-and-white SEM (Scanning Electronic Microscope) photo of the surface containing the substrates. In other words, the photo shows the silicon surface of the diffusion layer that has been obtained by forming the Ti film or the Ti—Si—N film and removing the film by using hydrofluoric acid.

The major conditions in film formation of the 1st aspect in FIG. 8 are:

| | |
|---|---|
| $TiCl_4$ gas | 10 SCCM |
| $H_2$ gas | 1000 SCCM |
| Ar gas | 1000 SCCM |
| $N_2$ gas | 50 SCCM |
| Wafer Temperature (Susceptor Temperature) | 605° C. |
| Film Forming Time | 30 seconds. |

The major conditions in film formation of the 2nd aspect in FIG. 9 are:

| | |
|---|---|
| $TiCl_4$ gas | 10 SCCM |
| $H_2$ gas | 1000 SCCM |
| Ar gas | 1000 SCCM |
| $N_2$ gas | 200 SCCM (which is added for only 6 seconds after starting the film formation, and its supply is stopped after this.) |
| Wafer Temperature (Susceptor Temperature) | 605° C. |
| Film Forming Time | 20 seconds. |

Further, the major conditions in the conventional film forming process in FIG. 7 are:

| | |
|---|---|
| $TiCl_4$ gas | 10 SCCM |
| $H_2$ gas | 1000 SCCM |
| Ar gas | 1000 SCCM |
| Wafer Temperature (Susceptor Temperature) | 605° C. |
| Film Forming Time | 14 seconds. |

When a metal film is formed by the conventional process, deep recess portions having a large diameter are formed on the silicon surface as shown in FIG. 7. On the other hand, shallow recess portions having a very small diameter are formed when a metal film is formed by the process of the present invention shown in FIGS. 8 and 9, which clarifies that the absorption of silicon is suppressed remarkably.

That is, as the projections shown in FIG. 11 are larger, they are more inclined to have the shape shown in FIG. 7.

Particularly, in the case of the 2nd aspect shown in FIG. 9, the recess portions have a very small diameter and are further shallow, which clarifies particularly a preferable state.

The above-described process conditions such as the amount of gas flow in the aspects show those of one example and are not limited to the above-described ones.

As described above, according to the metal film forming process and the multi layer structure of the present invention, the following excellent advantages can be obtained.

When a Ti film is formed on the surface of the processed body with $TiCl_4$ gas and $H_2$ gas used as the material gases, $N_2$ gas is added to the material gases so that a Ti—Si—N film is formed on the silicon surface, which can suppress corrosion and absorption of silicon of the semiconductor wafer.

Therefore, for example, when the contact metal embedded in the contact holes is formed, absorption of silicon which may break through the diffusion layer of the source and drain of the transistor can be prevented, and as a result, generation of the contact leak can be suppressed remarkably.

Particularly, by forming the contact metal in the double-layer structure of a Ti—Si—N film and a titanium silicide film, the above-described corrosion and absorption of silicon can be further suppressed.

In the present aspect, the diffusion layer of the circuit element formed of silicon on a semiconductor wafer has been described as the example. However, the diffusion layer is not limited to this. A layer including silicon may be formed on a substrate having insulation and the circuit element may be formed in the layer. For example, a silicon layer may be laminated on the glass substrate, and then the present aspect can be applied to a display panel of TFT (Thin-Film Transistor) forming the switching elements on the silicon layer. As for the substrate, a silicon layer may be formed on a resin substrate having insulation. If the metal film is formed on the silicon layer, the advantage can be obtained by easily applying the present invention to the film formation.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A process of forming a metal film, wherein as a metal film connected to a connection surface provided on a silicon semiconductor substrate, a Ti film is deposited by plasma enhanced chemical vapor deposition, said process comprising the steps of:

adding $N_2$ gas to material gas formed by mixing $TiCl_4$ gas and $H_2$ gas which is to be introduced into a plasma area in which said semiconductor substrate is placed, so as to form without addition of a silicon containing gas a Ti—Si—N film on said connection surface of said semiconductor substrate element, forming subsequently a TiN film which is to serve as a barrier, and depositing said Ti film on said TiN film.

2. A process of forming a metal film, wherein as a metal film connected to a connection surface provided on a silicon semiconductor substrate, a Ti film is deposited by plasma enhanced chemical vapor deposition, said process comprising the steps of:

adding $N_2$ gas to material gas formed by mixing $TiCl_4$ gas and $H_2$ gas which is to be introduced into a plasma area in which said semiconductor substrate is placed, so as to form a Ti—Si—N film on said connection surface, stopping the addition of said $N_2$ gas, forming a titanium silicide film on said Ti—Si—N film, depositing subsequently a TiN film which is to serve as a barrier, and depositing said Ti film as said metal film on said TiN film.

3. A method of forming a structure connecting a Si substrate to a Ti layer serving a mutual wiring layer, comprising the steps of:

a) forming without addition of a silicon containing gas a Ti—Si—N layer on a surface of said silicon substrate, by plasma enhanced chemical vapor deposition, by use of mixed as including halide gas of Ti, $H_2$ gas and gas including nitrogen atoms;

b) forming a TiN layer on said Ti—Si—N layer; and c) forming a Ti layer on said TiN layer.

4. The method according to claim 3, wherein supply of the gas including nitrogen atoms is terminated in the midst of the step a).

5. The method according to claim 4, wherein in the step a), radiofrequency of first power is applied before the supply of the gas including nitrogen atoms is terminated, and radiofrequency of second power smaller than the first power is applied after the supply of the gas including nitrogen atoms has been terminated.

6. The method according to claim 3, wherein the halide of Ti is $TiCl_4$ and the gas including nitrogen atoms is $N_2$ gas.

7. The method according to claim 3, further comprising a step of forming a titanium silicide layer on said Ti—Si—Ni layer before said TiN layer is formed.

* * * * *